(12) United States Patent
Aoi

(10) Patent No.: US 8,941,238 B2
(45) Date of Patent: Jan. 27, 2015

(54) SEMICONDUCTOR DEVICE

(71) Applicant: Panasonic Corporation, Osaka (JP)

(72) Inventor: Nobuo Aoi, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/759,833

(22) Filed: Feb. 5, 2013

(65) Prior Publication Data

US 2013/0140696 A1 Jun. 6, 2013

Related U.S. Application Data

(63) Continuation of application No. PCT/JP2011/004218, filed on Jul. 26, 2011.

(30) Foreign Application Priority Data

Feb. 10, 2011 (JP) .................................. 2011-027752

(51) Int. Cl.
*H01L 23/48* (2006.01)
*H01L 23/52* (2006.01)
(Continued)

(52) U.S. Cl.
CPC .......... *H01L 23/49811* (2013.01); *H01L 24/11* (2013.01); *H01L 24/13* (2013.01); *H01L 24/16* (2013.01); *H01L 2224/13565* (2013.01); *H01L 2224/1601* (2013.01); *H01L 2224/81193* (2013.01); *H01L 2224/81937* (2013.01);
(Continued)

(58) Field of Classification Search
CPC ............... H01L 2924/014; H01L 2924/01029; H01L 2924/01082; H01L 2924/15311; H01L 2224/13099; H01L 2224/13111
USPC ........................... 257/737, 738, 780; 438/613
See application file for complete search history.

(56) References Cited

U.S. PATENT DOCUMENTS 5,130,779 A * 7/1992 Agarwala et al. .............. 257/772
6,232,563 B1 * 5/2001 Kim et al. ...................... 174/261
(Continued)

FOREIGN PATENT DOCUMENTS

JP 04-293240 A 10/1992
JP 09-199542 A 7/1997
(Continued)

OTHER PUBLICATIONS

ITRS (The International Technology Roadmap for Semiconductors) 2007, Assembly and Packaging Chapter (Japanese Language Edition), pp. 41-42.
(Continued)

*Primary Examiner* — Zandra Smith
*Assistant Examiner* — John M Parker
(74) *Attorney, Agent, or Firm* — McDermott Will & Emery LLP

(57) ABSTRACT

A semiconductor device includes a first substrate; a plurality of first electrodes formed on the first substrate; and a first insulating film formed on sidewalls of the plurality of first electrodes. The first insulating film is formed not to fill spaces between the plurality of first electrodes.

15 Claims, 3 Drawing Sheets

(51) Int. Cl.
  *H01L 29/40* (2006.01)
  *H01L 23/498* (2006.01)
  *H01L 23/00* (2006.01)

(52) U.S. Cl.
  CPC ............. *H01L 2224/10145* (2013.01); *H01L 2224/11622* (2013.01); *H01L 2224/13686* (2013.01); *H01L 24/81* (2013.01); *H01L 2224/0345* (2013.01); *H01L 2224/0401* (2013.01); *H01L 2224/05147* (2013.01); *H01L 2224/05647* (2013.01); *H01L 2224/1145* (2013.01); *H01L 2224/11462* (2013.01); *H01L 2224/1147* (2013.01); *H01L 2224/13082* (2013.01); *H01L 2224/13111* (2013.01); *H01L 2224/13124* (2013.01); *H01L 2224/13144* (2013.01); *H01L 2224/13147* (2013.01); *H01L 2224/1357* (2013.01); *H01L 2224/81203* (2013.01); *H01L 2224/81815* (2013.01); *H01L 2224/05568* (2013.01); *H01L 2224/11831* (2013.01); *H01L 2224/03912* (2013.01); *H01L 2224/11827* (2013.01); *H01L 2224/05023* (2013.01)
  USPC .......................................... 257/738; 257/780

(56) References Cited

U.S. PATENT DOCUMENTS

| | | | | |
|---|---|---|---|---|
| 6,958,539 | B2* | 10/2005 | Lay et al. | 257/737 |
| 8,441,124 | B2* | 5/2013 | Wu et al. | 257/737 |
| 2002/0031904 | A1 | 3/2002 | Shibata et al. | |
| 2002/0048924 | A1 | 4/2002 | Lay et al. | |
| 2007/0080451 | A1* | 4/2007 | Suh | 257/737 |
| 2007/0231957 | A1 | 10/2007 | Mitsuhashi | |
| 2009/0149016 | A1* | 6/2009 | Park et al. | 438/614 |
| 2009/0315175 | A1 | 12/2009 | Okada et al. | |
| 2011/0049705 | A1* | 3/2011 | Liu et al. | 257/737 |

FOREIGN PATENT DOCUMENTS

| | | |
|---|---|---|
| JP | 2002-313832 A | 10/2002 |
| JP | 2004-296497 A | 10/2004 |
| JP | 2004-296497 A | 10/2004 |
| JP | 2007-266531 A | 10/2007 |

OTHER PUBLICATIONS

International Search Report mailed Oct. 18, 2011 issued in corresponding International Application No. PCT/JP2011/004218.

\* cited by examiner

SEMICONDUCTOR DEVICE

CROSS-REFERENCE TO RELATED APPLICATION

This is a continuation of International Application PCT/JP2011/004218 filed on Jul. 26, 2011, which claims priority to Japanese Patent Application No. 2011-027752 filed on Feb. 10, 2011. The disclosures of these applications including the specifications, the drawings, and the claims are hereby incorporated by reference in their entirety.

BACKGROUND

In recent years, with an increase in integration, function, and speed of semiconductor integrated circuit devices, three-dimensional integration techniques by chip-on-chip, chip-on-wafer, or wafer-on-wafer packaging of substrates using through electrodes have been suggested. (See, for example, ITRS (The International Technology Roadmap for Semiconductors) 2007, Assembly and Packaging Chapter (Japanese Language Edition), pp.41-42.)

This is because, in conventional two-dimensional miniaturization such as system-on-chip (SoC), degradation in performance is concerned, which is caused by a rise in the interconnection resistance due to grain boundary scattering and interface scattering of electrons with reduction in the cross-sectional areas of interconnects, and an increase in interconnection delays due to an increase in interconnect length.

Thus, in three-dimensional integration techniques, semiconductor integrated circuit devices are three-dimensionally stacked to increase areas capable of interconnection, thereby increasing the cross-sectional areas of the interconnects and reducing the interconnect length. That is, integration is accelerated and performance is improved.

In three-dimensional integration techniques, where substrates such as silicon substrates are stacked, metal electrodes are heated and compression-bonded using, for example, solder bumps etc. for electrical interconnection between the substrates in chip-on-chip, chip-on-wafer, or wafer-on-wafer packaging.

FIGS. 3A and 3B are cross-sectional views illustrating steps of electrode bonding in a conventional three-dimensional integration technique.

First, as shown in FIG. 3A, a substrate 11 having electrode pads 12 on its surface, and a substrate 21 having electrode pads 22 on its surface are prepared. Then, solder bumps 13 melting at a low temperature are formed on the electrode pads 12. After that, the substrate 11 and the substrate 21 are arranged so that the solder bumps 13 on the electrode pads 12 face the electrode pads 22. The solder bumps 13 may be made of, for example, an alloy containing tin.

Next, as shown in FIG. 3B, the solder bumps 13 on the electrode pads 12 are compression-bonded to the electrode pads 22, and then, the solder bumps 13 are heated to melt. After that, the solder bumps 13 are cooled and solidified. This bonds the electrode pads 12 on the substrate 11 to the electrode pads 22 on the substrate 21 with the solder bumps 13 interposed therebetween.

SUMMARY

However, in the conventional technique shown in FIGS. 3A and 3B, when the electrode pads 12 on the substrate 11 are bonded to the electrode pads 22 on the substrate 21 with the solder bumps 13 interposed therebetween, the solder bumps 13 are deformed by the thermocompression melt bonding to extend in a horizontal direction (i.e., the direction along the principal surfaces of the substrates 11 and 21, hereinafter the same) as shown in FIG. 4. Thus, where the intervals of the electrode pads 12 on the substrate 11 (i.e., the intervals of the electrode pads 22 on the substrate 21) are short, the adjacent solder bumps 13 are in contact with each other. This results in shorting to cause a malfunction of the device.

On the other hand, for example, Japanese Patent Publication No. H9-199542 (hereinafter referred to as Document 1) suggests thermocompression bonding electrodes, lowering the applied pressure while solder bumps melt, and expanding the melted solder bumps to prevent the solder bumps from extending in the horizontal direction in the compression bonding, and the adjacent solder bumps from coming in contact with each other.

In a semiconductor device practically used at present, electrodes are arranged on a substrate at pitches of about 40 µm. With further miniaturization of SoC packaging, an increase in the diameters of wafers, and an increase in the areas of chips, an increasing number of electrodes are bonded. This requires miniaturization of electrodes and further reduction in pitches (e.g., 10 µm in the future) between electrodes.

With further miniaturization of SoC packaging, an increase in the diameters of wafers, and an increase in the areas of chips, the degree of parallel alignment of substrates connected in chip-on-chip, chip-on-wafer, or wafer-on-wafer packaging, i.e., the distance between facing principal surfaces of the substrates becomes difficult to control with high precision.

In the electrode bonding suggested in Document 1, it is necessary to control the distance between the facing principal surfaces with high precision. Thus, with further miniaturization of SoC packaging, an increase in the diameters of wafers, and an increase in the areas of chips, etc., manufacturing devices for implementing the electrode bonding suggested in Document 1 are becoming expensive.

In view of the problem, the present disclosure provides a three-dimensional integration technique which reliably reduces shorting of adjacent electrodes caused by deformation of electrodes in electrode bonding, even when the intervals of the electrodes on a substrate are reduced. The technique will be described below.

A method of manufacturing a semiconductor device according to the present disclosure includes the steps of: (a) forming a plurality of first electrodes on a first substrate; and (b) forming a first insulating film on sidewalls of the plurality of first electrodes. In the step (b), the first insulating film is formed not to fill spaces between the plurality of first electrodes. Each of the first electrodes may have protrusion.

In the method according to the present disclosure, the first insulating film is formed on the sidewalls of the first electrodes on the first substrate, and thus functions as a support for preventing deformation of the first electrodes. This reliably reduces shorting between the adjacent first electrodes, i.e., malfunctions of the device, caused by deformation of the first electrodes (particularly deformation extending in the horizontal direction) in chip-on-chip, chip-on-wafer, or wafer-on-wafer packaging, when the electrodes on the upper and lower substrates are bonded by, for example, thermocompression melt bonding, even if the intervals of the electrodes on the first substrate are reduced. As compared to the case of implementing the conventional electrode bonding suggested in Document 1, the above-described advantages are obtained without using expensive manufacturing equipment.

In the method according to the present disclosure, the plurality of first electrodes may include a first conductive layer containing a first metal, and a second conductive layer formed on the first conductive layer, and containing a second metal different from the first metal. With this method, the electrodes on the upper and lower substrates are bonded by, for example, thermocompression bonding, and thus, at least part of the first electrodes is made of an alloy containing the first metal and the second metal. The first metal may have a higher melting point than the second metal. Where the first insulating film is formed at a temperature lower than the melting point of the second metal, melting of the second conductive layer containing the second metal is reduced in the step (b) (i.e., before bonding the electrodes of the upper and lower substrates). Where the first metal is copper, and the second metal is tin, the electrodes on the upper and lower substrates can be bonded by, for example, thermocompression bonding at a relatively low temperature. The step (a) may include the steps of: (a1) forming a seed layer for the first conductive layer on the first substrate, (a2) forming on the seed layer, a mask pattern having openings in formation regions of the plurality of first electrodes, (a3) selectively forming the first conductive layer on the seed layer in portions exposed to the openings of the mask pattern by plating, (a4) selectively forming the second conductive layer on the first conductive layer by plating, (a5) after the step (a4), removing the mask pattern, and (a6) after the step (a5), removing a portion of the seed layer located in a region from which the mask pattern is removed. This reliably forms the first electrodes having the multilayer of the first conductive layer containing the first metal and the second conductive layer containing the second metal. The step (a) may further include the step (a7), before the step (a1), forming a barrier layer on the first substrate. In the step (a6), a portion of the barrier layer located in the region from which the mask pattern is removed may be removed, thereby reducing diffusion of the material of the electrodes into the first substrate. The barrier layer may contain titanium.

In the method according to the present disclosure, the step (b) may include the steps of: (b1) forming the first insulating film on the first substrate to cover the plurality of first electrodes, and (b2) removing the first insulating film so that the first insulating film remains on at least part of the sidewalls of the plurality of first electrodes. In the step (b1), the first insulating film may be formed by CVD or coating. In the step (b2), the first insulating film may be removed by etch-back, or by mechanical polishing.

In the method according to the present disclosure, the first insulating film may be an oxide film or an organic film.

The method according to the present disclosure further includes the steps of: (c) forming a plurality of second electrodes on a second substrate in positions corresponding to the plurality of first electrodes on the first substrate, (d) forming a second insulating film on sidewalls of the plurality of second electrodes, (e), after the steps (b) and (d), arranging the first substrate and the second substrate so that the plurality of first electrodes face the corresponding plurality of second electrodes, and bonding the plurality of first electrodes to the corresponding one of the plurality of second electrodes. In the step (d), the second insulating film may be formed not to fill spaces between the plurality of second electrodes. With this method, the second insulating film is formed on the sidewalls of the second electrodes on the second substrate, and thus functions as a support for preventing deformation of the second electrodes. This reliably reduces shorting between the adjacent second electrodes, i.e., malfunctions of the device, caused by deformation of the second electrodes (particularly deformation extending in the horizontal direction), when the first and second electrodes are bonded by, for example, thermocompression bonding, even if the intervals of the electrodes on the second substrate are reduced. As compared to the case of implementing the conventional electrode bonding suggested in Document 1, the above-described advantages are obtained without using expensive manufacturing equipment. Each of the second electrodes may have protrusion. In the step (e), the plurality of first electrodes may be bonded to the corresponding plurality of second electrodes by thermocompression bonding at a temperature higher than or equal to a melting point of the second metal. After the step (e), the plurality of first electrodes and the plurality of second electrodes may contain an alloy containing tin. The alloy may contain copper.

A semiconductor device according to the present disclosure includes a first substrate; a plurality of first electrodes formed on the first substrate, and including a solder bump as an upper layer; and a first insulating film formed on sidewalls of the plurality of first electrodes. The first insulating film is formed not to fill spaces between the plurality of first electrodes. Each of the first electrodes may have protrusion.

In the semiconductor device according to the present disclosure, the first insulating film is formed on the sidewalls of the first electrodes on the first substrate, and thus functions as a support for preventing deformation of the first electrodes. This reliably reduces shorting between the adjacent first electrodes, i.e., malfunctions of the device, caused by deformation of the first electrodes (particularly deformation extending in the horizontal direction) in chip-on-chip, chip-on-wafer, or wafer-on-wafer packaging, when the electrodes on the upper and lower substrates are bonded by, for example, thermocompression melt bonding, even if the intervals of the electrodes on the first substrate are reduced. As compared to the conventional semiconductor device suggested in Document 1, the above-described advantages are obtained without using expensive manufacturing equipment.

In the semiconductor device according to the present disclosure, the plurality of first electrodes may include a first conductive layer containing a first metal, and a second conductive layer formed on the first conductive layer, and containing a second metal different from the first metal. With this structure, the electrodes on the upper and lower substrates are bonded by, for example, thermocompression bonding, and thus, at least part of the first electrodes is made of an alloy containing the first metal and the second metal. The first metal may have a higher melting point than the second metal. Where the first metal is copper, and the second metal is tin, the electrodes on the upper and lower substrates are bonded by, for example, thermocompression bonding at a relatively low temperature. Where the plurality of first electrodes include a barrier layer formed under the first conductive layer, diffusion of the material of the electrodes into the first substrate is reduced. The barrier layer may contain titanium.

In the semiconductor device of the present disclosure, the first insulating film may be an oxide film or an organic film.

The semiconductor device of the present disclosure further includes a second substrate; a plurality of second electrodes formed on the second substrate in positions corresponding to the plurality of first electrodes on the first substrate; and a second insulating film formed on sidewalls of the plurality of second electrodes. The second insulating film is formed not to fill spaces between the plurality of second electrodes. The first substrate and the second substrate are arranged so that the plurality of first electrodes face the corresponding plurality of second electrodes. The plurality of first electrodes are bonded to the corresponding plurality of second electrodes. With this structure, the second insulating film is formed on the sidewalls of the second electrodes on the second substrate, and thus functions as a support for preventing deformation of the second electrodes. This reliably reduces shorting between the adjacent second electrodes, i.e., malfunctions of the device, caused by deformation of the second electrodes (particularly deformation extending in the horizontal direction), when the first and second electrodes are bonded by, for example, thermocompression bonding, even if the intervals of the electrodes on the second substrate are reduced. As compared to the semiconductor device suggested in Document 1, the above-described advantages are obtained without using expensive manufacturing equipment. Each of the second electrodes may have protrusion. The plurality of first electrodes and the plurality of second electrodes may contain an alloy containing tin. The alloy may contain copper.

The technique according to the present disclosure provides a three-dimensional integration technique, which reliably reduces at low costs, shorting between adjacent electrodes caused by deformation of electrodes in bonding the electrodes, even if the intervals of the electrodes on the substrate are reduced.

DETAILED DESCRIPTION

An example semiconductor device and a method of manufacturing the device according to an embodiment of the present disclosure will be described hereinafter with reference to the drawings.

FIGS. 1A-1E and 2A-2D are cross-sectional views illustrating steps of the method of manufacturing the example semiconductor device according to the embodiment.

Figure 1A:
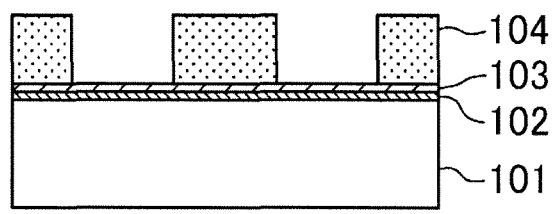
FIGS. 1A-1E are cross-sectional views illustrating steps of a method of manufacturing a semiconductor device according to an embodiment.

First, as shown in FIG. 1A, a first substrate 101 made of, for example, silicon is prepared. Although it is not shown, elements such as transistors and an interlayer insulating film (hereinafter referred to as an interconnect layer), which includes an interconnect electrically connected to the elements and covers the elements, are provided on a front surface of the first substrate 101. An insulating film made of, for example, silicon oxide and having a thickness of about 500 nm is formed on the interconnect layer. A connection hole connected to part of the interconnect layer is formed in the insulating film by, for example, dry etching.

A barrier layer 102 with a thickness of about 100 nm is formed to cover the surface of the insulating film including the connection hole. The barrier layer 102 may be made of a material which blocks diffusion of the material of the electrodes, which will be described later, into the first substrate 101, and may be, for example, titanium (Ti). Then, a seed layer 103 made of, for example, copper (Cu) and having a thickness of about 100 nm is formed on the barrier layer 102 by, for example, sputtering. Next, a resist pattern 104 having openings in electrode formation regions is formed on the seed layer 103. A hard mask may be formed instead of the resist pattern 104.

Figure 1B:
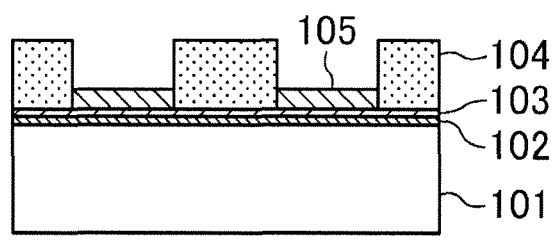

Then, as shown in FIG. 1B, a conductive layer 105 made of, for example, Cu and having a thickness of about 1 μm is selectively formed on parts of the seed layer 103, which are exposed to the openings of the resist pattern 104, by, for example, electrolytic plating.

Figure 1C:
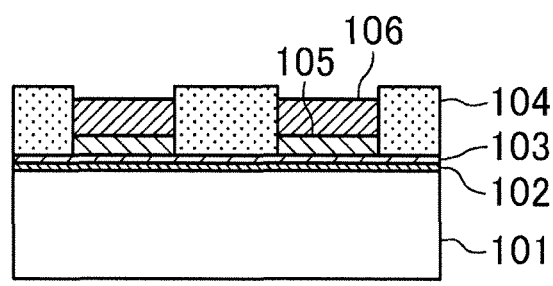

Next, as shown in FIG. 1C, a seed layer (not shown) made of, for example, tin (Sn) and having a thickness of about 100 nm is formed on the conductive layer 105. Then, a conductive layer 106 made of, for example, Sn and having a thickness of about 5 μm is selectively formed by, for example, electrolytic plating.

Figure 1D:
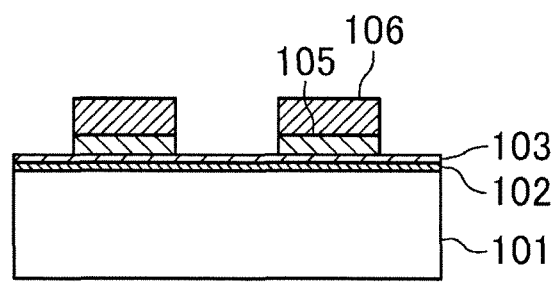
Figure 1E:
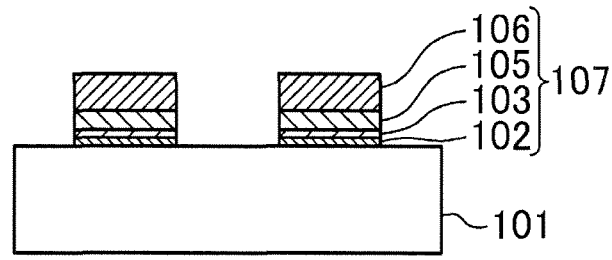

After that, as shown in FIG. 1D, the resist pattern 104 is removed, and then, as shown in FIG. 1E, the portions of the barrier layer 102 and the seed layer 103, which are covered by the resist pattern 104 in the steps shown in FIGS. 1A-1C, are removed by, for example, wet etching. As a result, a plurality of protruding first electrodes 107, which have a multilayer of the conductive layer 105 made of Cu and the conductive layer 106 made of Sn, are formed on the first substrate 101. The first electrodes 107 may have a cylindrical shape or a prismatic shape, but the shapes are not limited thereto.

Figure 2A:
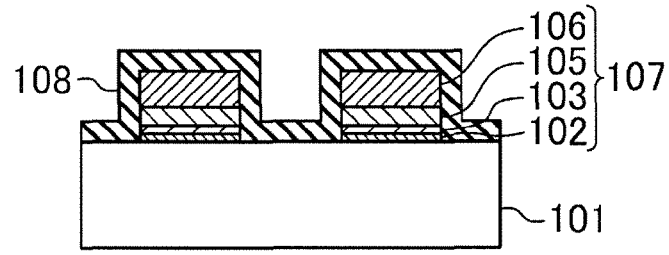
FIGS. 2A-2D are cross-sectional views illustrating steps of the method of manufacturing the semiconductor device according to the embodiment.

Then, as shown in FIG. 2A, a first insulating film 108 made of, for example, silicon oxide and having a thickness of about 500 nm is formed on the first substrate 101 to cover the first electrodes 107. The first insulating film 108 is formed by, for example, chemical vapor deposition (CVD) at a temperature lower than the melting point (about 232° C.) of Sn contained in the conductive layer 106, for example, at a temperature of 200° C. or lower. As such, the first insulating film 108 is formed at a low temperature, thereby avoiding melting of the conductive layer 106 containing Sn. That is, one of the features of the present disclosure is that the metal (e.g., Sn) contained in the conductive layer 106, which is the upper layer in the first electrodes 107, has a lower melting point than the metal (e.g., Cu) contained in the conductive layer 105, which is the lower layer in the first electrodes 107, and the first insulating film 108 is formed at a temperature lower than the melting point of the metal contained in the conductive layer 106.

Figure 2B:
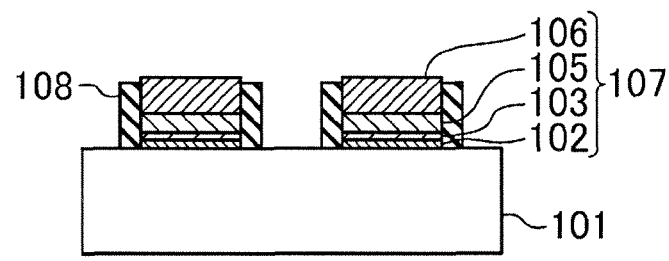

Next, as shown in FIG. 2B, the entire surface of the first insulating film 108 formed on and above the first substrate 101 is etched back by anisotropic dry etching, thereby removing the first insulating film 108 so that the first insulating film 108 remains on part of sidewalls of the first electrodes 107. This exposes the tops of the first electrodes 107, and removes the first insulating film 108 from the spaces between the first electrodes 107. The first insulating film 108 may not remain on the portions of the sidewalls of the first electrodes 107 near the tops.

Figure 2C:
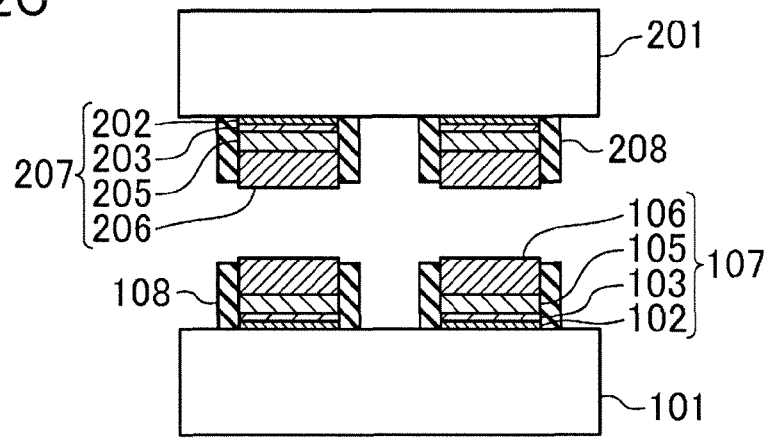

After that, a second substrate 201 made of, for example, silicon is prepared, and is subject to the steps similar to the steps shown in FIGS. 1A-1E, 2A and 2B. As a result, as shown in FIG. 2C, the second substrate 201 having a plurality of second electrodes 207 formed on the surface is obtained. Each of the second electrodes 207 is formed by sequentially stacking a barrier layer 202, a seed layer 203, a conductive layer 205, and a conductive layer 206, which respectively correspond to the barrier layer 102, the seed layer 103, the conductive layer 105, and the conductive layer 106 forming the first electrodes 107. A second insulating film 208, which corresponds to the first insulating film 108 formed on the sidewalls of the first electrodes 107, is formed on the sidewalls of the second electrodes 207. The second electrodes 207 are formed on the second substrate 201 in the position corresponding to the first electrodes 107 on the first substrate 101.

Figure 2D:
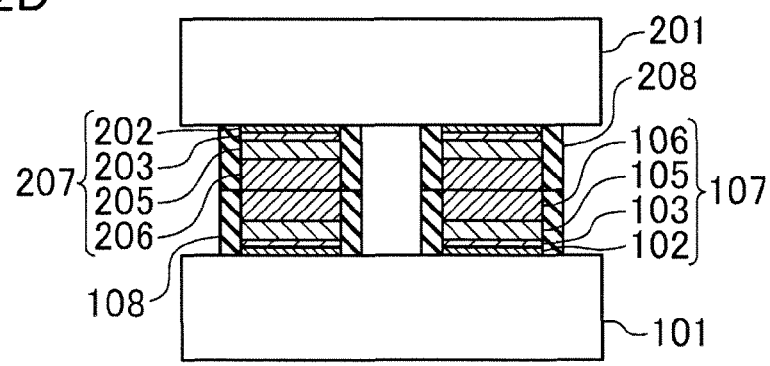
Figure 3A:
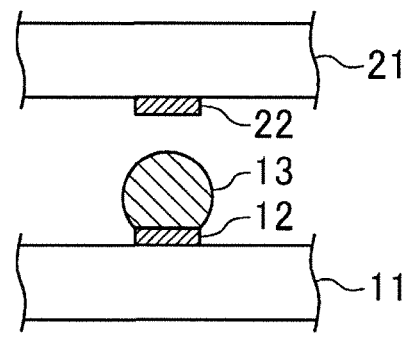
FIGS. 3A and 3B are cross-sectional views illustrating steps of a method of manufacturing a conventional semiconductor device.
Figure 3B:
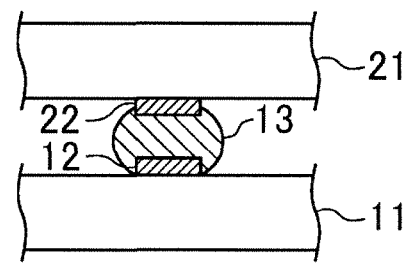
Figure 4:
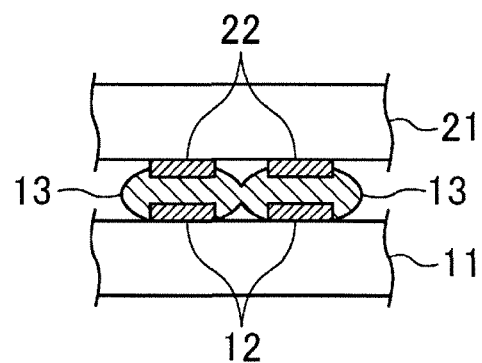
FIG. 4 illustrates problems of the conventional semiconductor device.

Next, as shown in FIG. 2C, the first substrate 101 and the second substrate 201 are arranged so that the first electrodes 107 face the second electrodes 207. Then, as shown in FIG. 2D, the first electrodes 107 are bonded to the second electrodes 207. Specifically, the first electrodes 107 are in contact with the second electrodes 207, and are then subject to thermocompression bonding, for example, at a temperature higher than or equal to a melting point (about 232° C.) of Sn contained in the conductive layer 106 and the conductive layer 206, thereby bonding the first electrodes 107 to the second electrodes 207. Then, Sn contained in the conductive layer 106 and the conductive layer 206 melts to integrate the conductive layer 106 and the conductive layer 206. At this time, Cu contained in the conductive layer 105, which includes the seed layer 103, and the conductive layer 205, which includes the seed layer 203, partially melts. As a result, at least part of the first electrodes 107 and the second electrodes 207 may be made of a Sn—Cu alloy.

According to the above-described embodiment, when the first electrodes 107 are bonded to the second electrodes 207 in the step shown in FIG. 2D, the first insulating film 108 formed on the sidewalls of the first electrodes 107 functions as a support for preventing deformation of the first electrodes 107, and the second insulating film 208 formed on the sidewalls of the second electrodes 207 functions as a support for preventing deformation of the second electrodes 207. This reduces deformation of the material of the electrodes, which has melted when the first electrodes 107 and the second electrodes 207 are compression bonded, in the horizontal direction. Specifically, even if the intervals of the adjacent first electrodes 107 (i.e., the intervals of the adjacent second electrodes 207) are, for example, about 10 μm or shorter, shorting between the adjacent first electrodes 107, and shorting between the adjacent second electrodes 207 can be reduced, thereby reliably reducing malfunctions of the device. As compared to the case of implementing the conventional electrode bonding suggested in Document 1, the above-described advantages are obtained without using expensive manufacturing equipment.

In this embodiment, the first insulating film 108 (and/or the second insulating film 208) is formed on the sidewalls of the first electrodes 107 (and/or the second electrodes 207). Thus, even if the heights of the first electrodes 107 (and/or the second electrodes 207) vary on the first substrate 101 (and/or the second substrate 201), shorting between the adjacent first electrodes 107 (and/or the adjacent second electrodes 207) are reduced, and the stroke available for compression bonding are increased. That is, the pressing range for compression bonding of the first electrodes 107 and the second electrodes 207 is increased.

In this embodiment, the first electrodes 107 and the second electrodes 207, which are the above-described protruding electrodes (bumps), are formed on the first substrate 101 and the second substrate 201, respectively. However, the ones of the first electrodes 107 or the second electrodes 207 may be formed as the above-described protruding electrodes, and the others may be formed as electrodes (e.g., through electrodes) having other structures, such as electrode pads having a surface substantially flush with exposed ends of electrodes or the uppermost surface of the substrate. That is, the above-described advantages are obtained by using the above-described protruding electrodes for the electrodes formed on at least one of the first substrate 101 or the second substrate 201.

In this embodiment, after the first insulating film 108 has been formed, etch-back is performed to expose the tops of the first electrodes 107 by the anisotropic dry etching. Instead, the first insulating film 108 may be removed by mechanical polishing such as chemical mechanical polishing (CMP) so that the first insulating film 108 remains on at least part of the sidewalls of the first electrodes 107. This is also applicable to the second insulating film 208. Where mechanical polishing is used, the first insulating film 108 and the second insulating film 208 may partially remain in the spaces between the first electrodes 107 and between the second electrodes 207.

In this embodiment, the first insulating film 108, which is the oxide film, is formed by CVD at a low temperature to cover the sidewalls of the first electrodes 107. However, the formation and the type of the first insulating film 108 are not limited thereto. For example, coating etc. may be used instead of CVD. Instead of the oxide film, for example, an organic film made of a polyimide resin etc., having a high glass-transition temperature (Tg) may be formed by, for example, CVD, coating, etc. This is also applicable to the second insulating film 208. Note that, in view of preventing deformation of the first electrodes 107 and the second electrodes 207, the first insulating film 108 and the second insulating film 208 may be made of a relatively hard insulating material such as a silicon oxide film or a silicon oxynitride film.

In this embodiment, in the steps shown in FIGS. 1A-1C, the conductive layers 105 and 106 are selectively formed by electrolytic plating using the resist pattern 104 as a mask. The formation of the conductive layers 105 and 106 is not limited thereto. Specifically, other plating techniques may be used instead of electrolytic plating. Alternatively, for example, film formation by sputtering etc. and patterning by lithography and dry etching may be combined instead of selective growth by plating. This is also applicable to the conductive layers 205 and 206.

In this embodiment, the conductive layer 105 is made of Cu, and the conductive layer 106 is made of Sn. However, the materials of the conductive layers 105 and 106 are not limited thereto, and may be any material as long as the electrodes on the upper and lower substrates are bonded by thermocompression bonding at a relatively low temperature. Specifically, the conductive layer 105 may be made of aluminum (Al), and the conductive layer 106 may be made of gold (Au). This is also applicable to the conductive layers 205 and 206.

In this embodiment, in the step shown in FIG. 2D, the first electrodes 107 are preferably bonded to the second electrodes 207 so that the first insulating film 108 formed on the sidewalls of the first electrodes 107 are in contact with the second insulating film 208 formed on the sidewalls of the second electrodes 207. This reliably reduces deformation of the melted material of the electrodes in the horizontal direction, when the first electrodes 107 are compression bonded to the second electrodes 207. Note that, even if a slight space is left between the first insulating film 108 formed on the sidewalls of the first electrodes 107 and the second insulating film 208 formed on the sidewalls of the second electrodes 207, when the first electrodes 107 are bonded to the second electrodes 207, the advantage of reducing the deformation of the material of the electrodes in the horizontal direction is not substantially lost.

The semiconductor device according to this embodiment and the method of manufacturing the device are applicable to chip-on-chip packaging, in which semiconductor devices in the form of chips obtained by wafer dicing are stacked, chip-on-wafer packaging, in which semiconductor devices in the form of chips and in the form of undiced wafers are stacked, or a wafer-on-wafer semiconductor, in which semiconductor devices in the form of wafers are stacked, and a method of manufacturing the device.

As described above, the semiconductor device and the method of manufacturing the device according to the present disclosure provide a three-dimensional integration technique, which reliably reduces at low costs, shorting between adjacent electrodes caused by deformation of electrodes in bonding the electrodes, even if the intervals of the electrodes on the substrate are reduced. Thus, the semiconductor device and the method of manufacturing the device according to the present disclosure are particularly useful as a technique of bonding electrodes such as solder bumps in a semiconductor device formed by chip-on-chip, chip-on-wafer, or wafer-on-wafer packaging.

What is claimed is:

1. A semiconductor device, comprising:
a first substrate;
a plurality of first electrodes formed on the first substrate; and
a first insulating film formed on sidewalls of each of the plurality of first electrodes,
a second substrate;
a plurality of second electrodes formed on the second substrate in positions corresponding to the plurality of first electrodes on the first substrate; and
a second insulating film formed on sidewalls of each of the plurality of second electrodes, wherein
the first insulating film is formed not to fill spaces between adjacent ones of the plurality of first electrodes,
the second insulating film is formed not to fill spaces between adjacent ones of the plurality of second electrodes,
the first substrate and the second substrate are arranged so that the plurality of first electrodes face the corresponding plurality of second electrodes,
the plurality of first electrodes are bonded to the corresponding plurality of second electrodes, and
the first insulating film formed on the sidewalls of each of the plurality of first electrodes is in contact with the second insulating film formed on the sidewalls of each of the plurality of second electrodes.

2. The semiconductor device of claim 1, wherein each of the plurality of first electrodes and the plurality of second electrodes includes:
a first conductive layer containing a first metal, and
a second conductive layer formed on the first conductive layer, and containing a second metal different from the first metal.

3. The semiconductor device of claim 2, wherein
the first metal is copper, and
the second metal is tin.

4. The semiconductor device of claim 2, wherein each of the plurality of first electrodes and the plurality of second electrodes further includes a barrier layer under the first conductive layer.

5. The semiconductor device of claim wherein the barrier layer contains titanium.

6. The semiconductor device of claim 2, wherein the first conductive layer is a substantially flat plate.

7. The semiconductor device of claim 2, further comprising: a second conductive layer between the first conductive layer and the substrate, wherein the first insulating film is formed on sidewalls of the second conductive layer.

8. The semiconductor device of claim 7, wherein the first substrate and the second substrate are substantially flat plates.

9. The semiconductor device of claim 7, wherein the first conductive layer and the second conductive layer are substantially flat plates.

10. The semiconductor device of claim 1, wherein the first insulating and the second insulating film are oxide films or organic films.

11. The semiconductor device of claim 1, wherein the plurality of first electrodes and the plurality of second electrodes contain an alloy containing tin.

12. The semiconductor device of claim 11, wherein the alloy further contains copper.

13. The semiconductor device of claim 1, wherein the first substrate and the second substrate are substantially flat plates.

14. The semiconductor device of claim 1, wherein the first insulating film and the second insulating film are formed of silicon oxide.

15. The semiconductor device of claim 1, wherein the first insulating film and the second insulating film are formed by chemical vapor deposition.

* * * * *